United States Patent
Kasha et al.

(10) Patent No.: US 9,190,975 B2
(45) Date of Patent: Nov. 17, 2015

(54) RECEIVER CHIP WITH MULTIPLE INDEPENDENT LOOP-THROUGH PATHS

(71) Applicant: SILICON LABORATORIES INC., Austin, TX (US)

(72) Inventors: Dan B. Kasha, Seattle, WA (US); Russell Croman, Buda, TX (US); Mike R. May, Austin, TX (US); Mark W. May, Austin, TX (US); Navin Harwalkar, Austin, TX (US); Tim Stroud, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 98 days.

(21) Appl. No.: 14/040,000

(22) Filed: Sep. 27, 2013

(65) Prior Publication Data

US 2015/0094007 A1    Apr. 2, 2015

(51) Int. Cl.
*H04B 1/00* (2006.01)
*H03G 3/30* (2006.01)

(52) U.S. Cl.
CPC .................................. *H03G 3/3052* (2013.01)

(58) Field of Classification Search
USPC ................. 455/132, 136, 137, 140, 142, 143, 455/232.1, 234.1, 247.1
See application file for complete search history.

(56) References Cited

U.S. PATENT DOCUMENTS

| | | | |
|---|---|---|---|
| 7,463,876 B2 * | 12/2008 | Matsui et al. | 455/333 |
| 8,254,862 B2 | 8/2012 | Kasha et al. | |
| 2008/0012986 A1 * | 1/2008 | Tai | 348/554 |
| 2012/0243640 A1 * | 9/2012 | Babitch et al. | 375/329 |
| 2013/0016633 A1 * | 1/2013 | Lum et al. | 370/277 |

* cited by examiner

*Primary Examiner* — Blane J Jackson
(74) *Attorney, Agent, or Firm* — Meyertons, Hood, Kivlin, Kowert & Goetzel, P.C.; Erik A. Heter; Dean M. Munyon (57) ABSTRACT

A radio receiver and method of operating the same are disclosed. In one embodiment, the radio receiver may include a RF receive path configured to convey a first radio signal within a first band to a radio tuning circuit. The RF receive path may be controllable using a first AGC circuit. The radio receiver may also include a loop-through path configured to convey a second radio signal within a second band between an input and an output of the radio receiver. The second band may be different from the first band. The loop-through path may be controllable using a second AGC circuit.

20 Claims, 6 Drawing Sheets

RECEIVER CHIP WITH MULTIPLE INDEPENDENT LOOP-THROUGH PATHS

BACKGROUND

1. Technical Field

This disclosure relates to integrated circuits, and more particularly, integrated circuits used in radio equipment.

2. Description of the Related Art

In recent years, radio tuners/receivers have been designed with increasing numbers of features. Specifically, radio broadcast has expanded beyond traditional AM/FM radio, and now includes HD radio, DAB radio and DRM standards. Further, additional frequency spectrum can be used in some radio standards, such as DAB's use of Lband. These new frequency channels add additional hardware complexity to optimize system performance. Finally, multiple antennas can be used to improve the performance of the radio system. Thus, with increasing complexity of radio systems, new architectures are needed to deliver high quality services to the customer.

Figure 1:
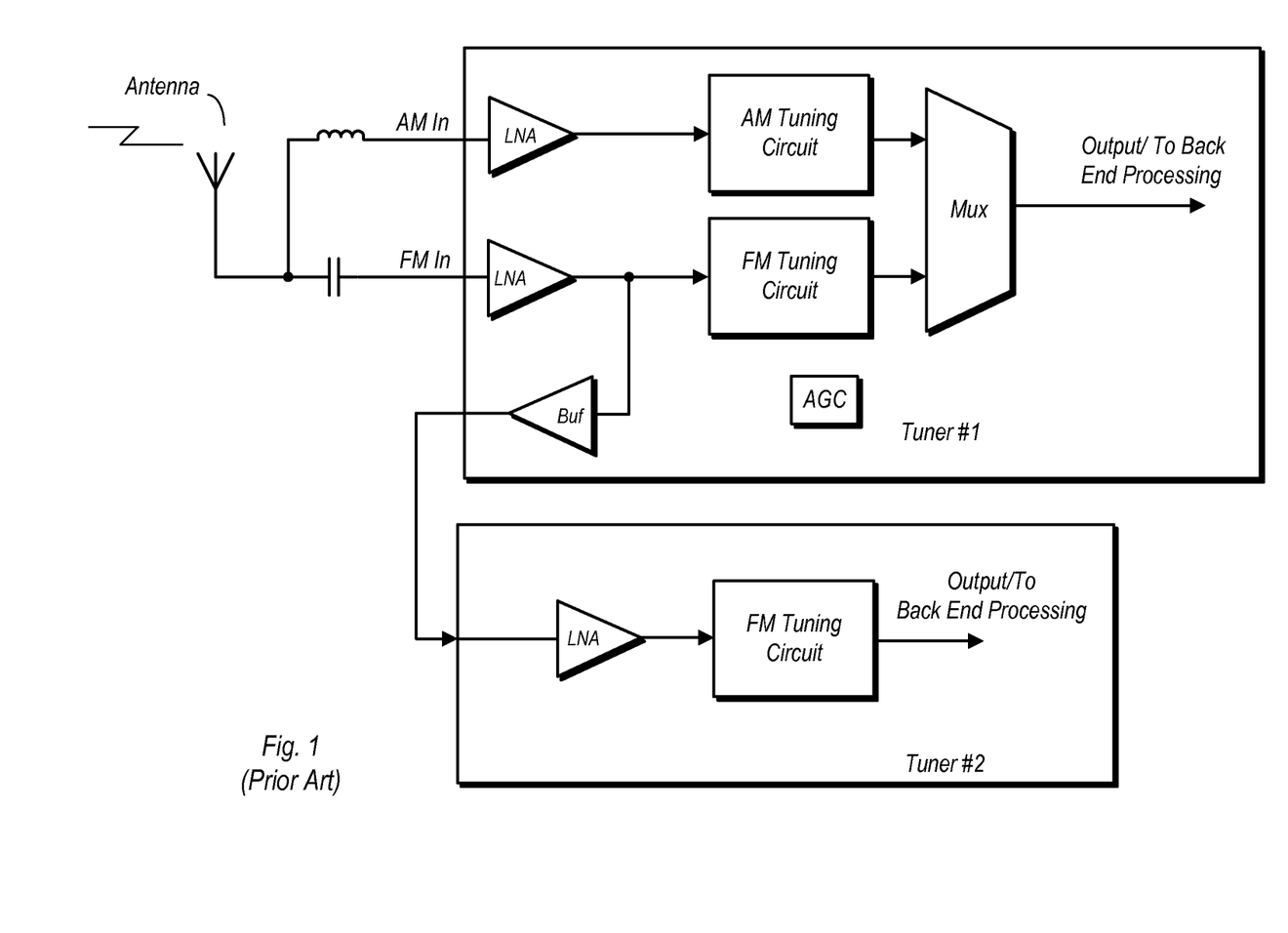
FIG. 1 (Prior Art) is a block diagram of one embodiment of a radio having two tuners.

FIG. 1 (Prior Art) is a diagram illustrating one embodiment of a radio capable of operating multiple tuners concurrently. In the embodiment shown, Tuner #1 includes an amplitude modulation (AM) tuning circuit and an FM tuning circuit. The AM and FM tuning circuits may each include a mixer and a local oscillator. A multiplexer ('Mux') is coupled to the outputs of both tuning circuits, and may select one for further processing as the received signal by Tuner #1. Automatic gain control (AGC) circuitry is implemented in Tuner #1, and may provide gain control for the band selected by the multiplexer.

Tuner #1 also includes a loop-through path for the FM input. That is, the FM signal may pass through an LNA and a buffer to an output which is coupled to an input of Tuner #2. Although the signal may pass through both an LNA and a buffer, it is nevertheless not subject to AGC. Instead, the FM signal may be gain-controlled by Tuner #2 after receiving it from the loop-through output of Tuner #1.

SUMMARY OF THE DISCLOSURE

A radio receiver and method of operating the same is disclosed. In one embodiment, the radio receiver may include a radio frequency (RF) receive path configured to convey a first radio signal within a first band to a radio tuning circuit. The RF receive path may be controllable using a first AGC circuit. The radio receiver may also include a loop-through path configured to convey a second radio signal within a second band between an input and an output of the radio receiver. The second band may be different from the first band. The loop-through path may be controllable using a second AGC circuit.

In one embodiment, a method includes conveying a radio signal in a first path to a radio tuning circuit via a tuning path. The method further includes controlling the gain of the first radio signal using first AGC circuitry. The method further includes conveying a second radio signal in a second band on a loop-through path between an input and an output of the radio receiver, with the second band being different from the first band. The gain of the second radio signal is controlled using second AGC circuitry.

In one embodiment, the receiver may be implemented on a single integrated circuit chip. Each of the loop-through paths may include a low noise amplifier (LNA) and may also include a buffer circuit (e.g., an amplifier designed to drive an output pin). Radio frequency (RF) signals may be conveyed through each of the loop-through paths, from input to output, simultaneously or concurrently, with each of the loop-through paths being under AGC separately from the other loop-through paths (i.e. each loop-through path includes separate AGC circuitry). Each of the loop-through paths may be configured for conveying signals from a unique one of a number of different frequency bands. The receiver circuit may also function as a primary tuner/receiver for one of the bands. A selection circuit may be used to select the band to be conveyed to the primary tuner/receiver on the chip, while other received bands may pass through their respective loop-through paths. The band selected to be conveyed by the primary tuner/receiver may also pass through a loop-through path.

BRIEF DESCRIPTION OF THE DRAWINGS

Other aspects of the disclosure will become apparent upon reading the following detailed description and upon reference to the accompanying drawings which are now described as follows.

While the subject matter disclosed herein is susceptible to various modifications and alternative forms, specific embodiments thereof are shown by way of example in the drawings and will herein be described in detail. It should be understood, however, that the drawings and description thereto are not intended to be limiting to the particular form disclosed, but, on the contrary, is to cover all modifications, equivalents, and alternatives falling within the spirit and scope of the present disclosure as defined by the appended claims.

DETAILED DESCRIPTION

Figure 2:
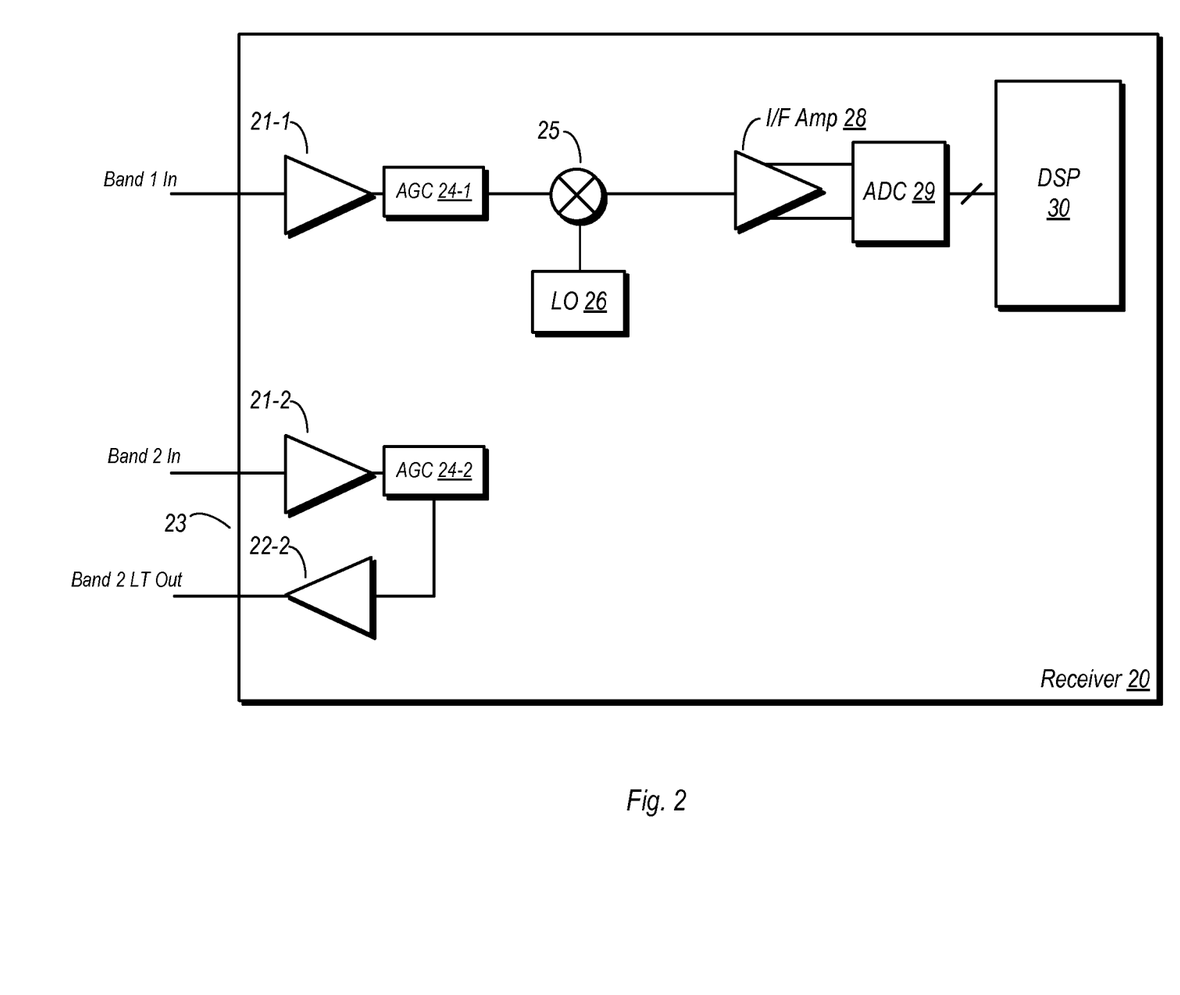
FIG. 2 is a block diagram illustrating one embodiment of a receiver having a RF receive path and a loop-through path.

FIG. 2 is a block diagram illustrating one embodiment of a receiver implemented on an integrated circuit chip. In the embodiment shown, receiver 20 includes two inputs, a first input for Band 1 and a second input for Band 2. Signals received through the Band 1 input may be received in a first radio band, while signals received through the Band 2 input may be received in a second radio band that is different than the first. As used in here, the term "different" with respect to two or more radio bands indicates that these bands each occupy a unique range of frequencies. For example, Band 1 may receive signals in the FM band, while Band 2 may receive signals in the AM band. Other bands are possible and contemplated, such as digital audio broadcast DAB L-band and DAB band III, among others.

The Band 1 input in the embodiment shown is received into a RF receive path. In this particular example, the RF receive path implements a heterodyne receiver in which the RF signal is down converted to an IF signal before further processing and final conversion to a baseband signal. It is noted however that embodiments implementing a zero IF conversion receiver architecture are also possible and contemplated, and thus the heterodyne example shown here is not intended to be limiting. The RF receive path includes a first low noise amplifier (LNA) 21-1, AGC circuitry 24-1, a mixer 25 that is coupled to receive a signal from a local oscillator 26, an IF amplifier 28, an analog-to-digital converter (ADC) 29 and a digital signal processor 30. An IF signal received from IF amplifier 28 may be converted into digital data by ADC 29 and further processed (including conversion to baseband) by DSP 30. Although not explicitly shown, DSP 30 may be coupled to output the processed data to other circuitry that may be internal or external to receiver 20 (e.g., a digital-to-analog converter, or DAC, for converting the digital data to audio for output to speakers). Some embodiments may not have an ADC and DSP and may instead output the IF as an analog signal for processing in another IC or circuit.

The Band 2 input in the embodiment shown is coupled to a loop-through path 23. The loop-through path 23 in the embodiment shown includes a second LNA 21-2, AGC circuitry 24-2, and a buffer 22-2, which is coupled to the Band 2 loop-through output. AGC circuitry 24-2 is configured to automatically control the gain of the Band 2 radio signal separate from AGC 24-1 in the RF receive path. In general, various embodiments of receiver 20 implement multiple instances of AGC circuitry 24, each of which may operate separately from one another. As will be discussed, embodiments having multiple loop-through paths that are each gain controlled using dedicated instances of AGC circuitry 24 may be implemented to allow multiple loop-through paths to provide a gain controlled output signal. Alternate embodiments may also include combining the functionality of LNA 21-2 and buffer 22-2 into a single amplifier stage, where the AGC 24-2 adjusts the gain of the composite amplifier. Another alternate embodiment of the circuitry shown in FIG. 2 may be implemented such that the AGC function may be co-mingled with the amplifier function so that, for example, the gain of the LNA is adjusted based on the signal size.

While embodiments are possible and contemplated wherein a receiver is implemented using discrete components or separate integrated circuits (ICs), receiver 20 as shown herein may be implemented on a single IC die. Accordingly, such an IC may include multiple, separate paths each under the control of a dedicated instance of AGC circuitry 24 that operates separately from AGC circuitry in the other paths. This in turn may enable a number of different signal paths associated with corresponding different bands to be implemented on a single IC die.

Figure 3A:
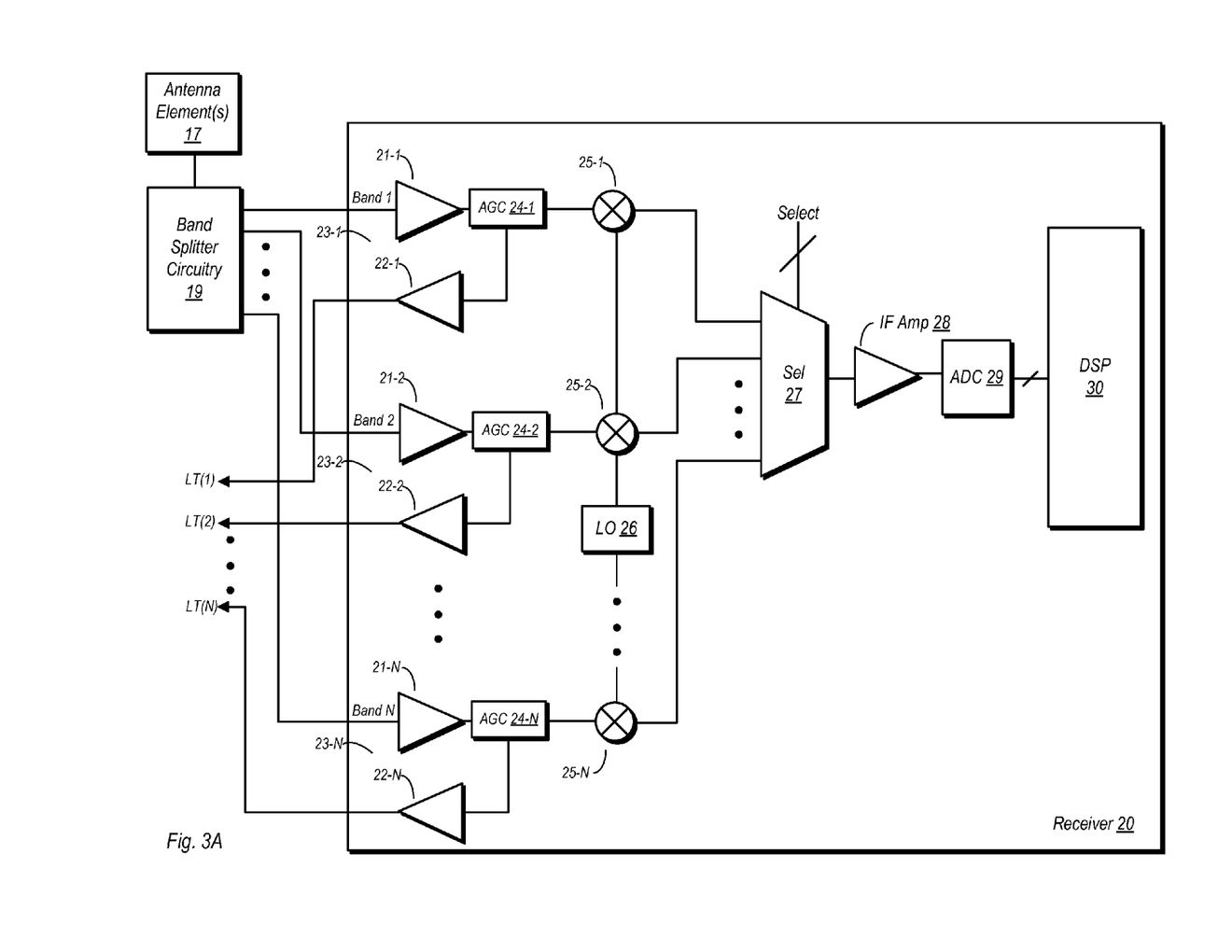
FIG. 3A is a block diagram illustrating of one embodiment of a receiver chip.

Tuning now to FIG. 3A, a block diagram of another embodiment of a receiver 20 is illustrated. Receiver 20 in this example is coupled to receive a number (N) of different radio signals from band splitting circuitry 19. In turn, band splitter circuitry may receive radio signals from antenna elements 17, which may comprise one or more antennas. It is noted that receiver 20 may also receive radio signals via other mechanisms, such as through a splitter coupled to a coaxial cable, to use one example. In another example implementation, one or more inputs of a receiver 20 may be coupled to loop-through outputs of another receiver, such as another instance of receiver 20.

In the embodiment shown, receiver 20 includes N inputs and N loop-through paths 23. For example, the Band 1 input may convey a radio signal into loop-through path 23-1, Band 2 may convey another radio signal into loop-through path 23-2, and so forth. Each loop-through path 23 includes a corresponding LNA 21, buffer 22, and AGC circuitry 24 (e.g., LNA 21-1, buffer 22-1, and AGC 24-1 in loop-through path 23-1).

Each of the AGC circuits 24 may operate separately from the others. For example, AGC 24-1 may provide AGC for a Band 1 radio signal received via LNA 21-1, while AGC 24-2 may provide AGC for a Band 2 signal received via LNA 21-2. Furthermore, receiver 20 is configured such that multiple loop-through paths may operate simultaneously, each conveying a signal within its specified band. Additionally, one of the loop-through paths may be selected for coupling to a corresponding mixer 25 and may thus act as the main RF receive path for receiver 20 during the time that other loop-through paths are operating. Furthermore, the path used as the main RF receive path may at the same time have its loop-through path conveying its signal to its corresponding loop-through output.

The use of multiple loop through paths and a main RF receive path simultaneously may thus be enabled by the used of separate instances of an AGC circuit 24 for each loop-through path 23. It is noted that specific instances of an AGC circuit 24 may be different from others. For example, since AGC 24-1 is configured to perform AGC for radio signals received in Band 1, it may have a different circuit topology and/or use components having different values than AGC 24-2, which is used for performing AGC for radio signals in Band 2. In general, a given band may have noise and/or linearity requirements that are unique to that band. Thus, the corresponding circuitry for a given band, including the AGC circuitry, may be specially configured for that band. In prior art embodiments in which the loop-through paths are not separately controlled using AGC, it may not be possible to pass multiple signals in multiple different bands.

The bands received through the various inputs may be different from one another. However, it is possible in some embodiments that multiple inputs may be provided for the same band. Furthermore, circuitry in some embodiments of receiver 20 may be re-configured to receive different bands at different times.

Receiver 20 includes a number of mixers, 25-1, 25-2, etc., up to 25-N. A local oscillator 26 is coupled to each of the mixers 25. The frequency of a signal provided by the local oscillator 26 may be variable in order to downconvert a radio signal in a selected band. The output of each mixer 25 may be coupled to an input of a selection circuit 27. The selection circuit 27 is coupled to receive one or more selection signals to cause one of the inputs to be selected. When a particular input is selected, its corresponding path in receiver 20 may become the RF receive path in use at that particular time, even if the corresponding loop-through path 23 is also being used. When a particular input of selection circuit 27 is selected, the path from the input to DSP 30 effectively becomes the RF receive path for receiver 20.

The output of selection circuit 27 is coupled to IF amplifier 28, which performs amplification of an IF signal. While the embodiment shown in FIG. 3A is implemented as a heterodyne receiver, other embodiments implementing a zero-IF receiver architecture are possible and contemplated. In such embodiments, IF amplifier 28 may be replaced with a baseband amplifier or other appropriate circuitry. The output of IF amplifier 28 in FIG. 3A is coupled to ADC 29, which converts the received signal to a digital format and provides a corresponding stream of digital data to DSP 30 for further processing. However, as noted above, some embodiments may be implemented such that the output of IF amplifier 28 is processed as an analog signal instead of being converted into a digital format. Moreover, embodiments are possible and contemplated wherein all back end processing is conducted in the analog domain rather than converting to digital.

Figure 3B:
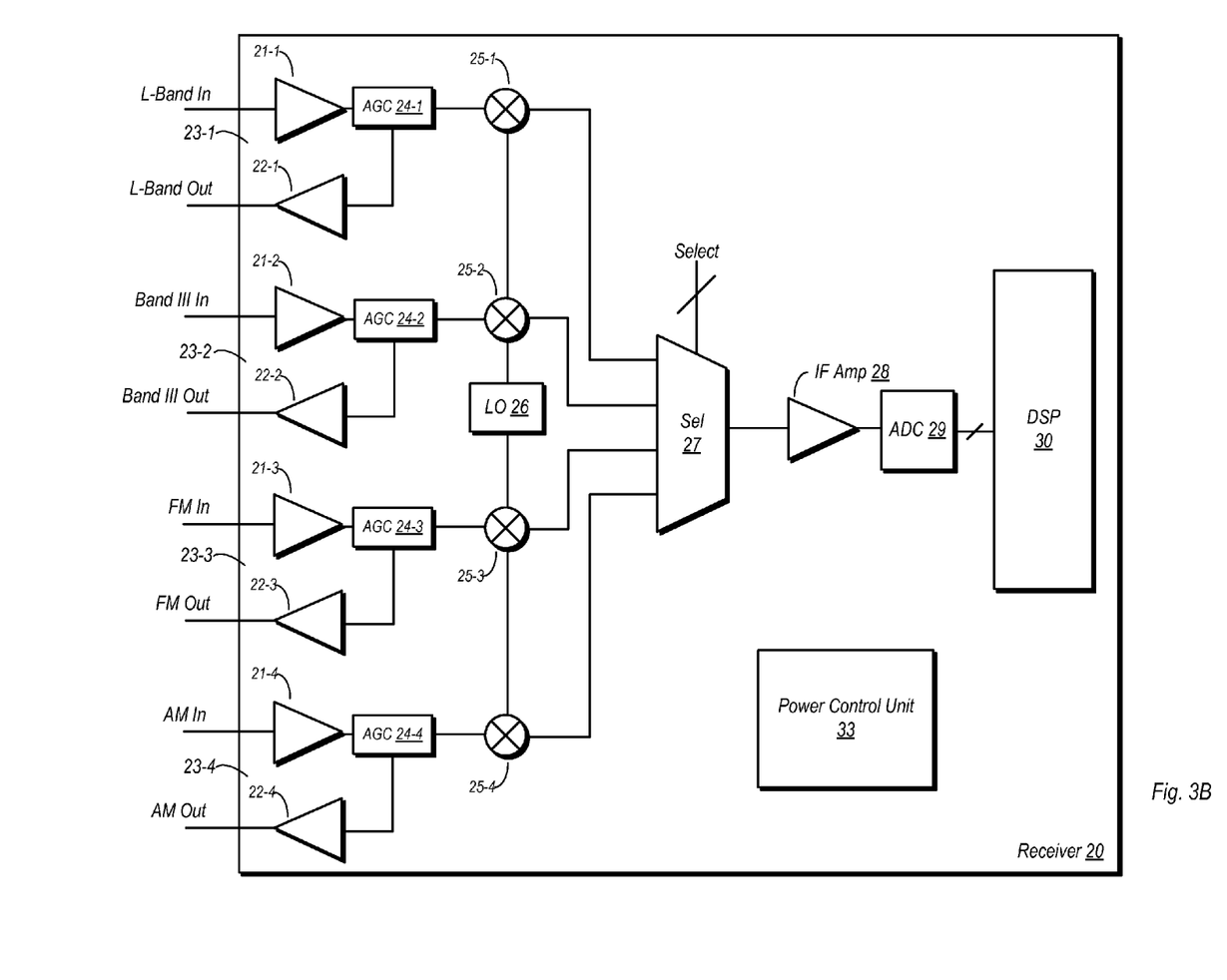
FIG. 3B is a block diagram illustrating another embodiment of a receiver chip.

FIG. 3B is another embodiment of a receiver 20. More particularly, FIG. 3B illustrates an embodiment that is one specific implementation of the more general embodiment shown in FIG. 3A. In the embodiment shown in FIG. 3B, receiver 20 includes four loop-through paths 23. Each loop-through path 23 is configured to convey signals on a band that is unique with respect to that of the other loop-through paths 23. Loop-through path 23-1 is configured to convey signals in the DAB L-Band. Loop-through path 23-2 is configured to convey signals in DAB Band III. Loop-through path 23-3 is configured to convey signals in the FM band. Loop-through path 23-4 is configured to convey signals in the AM band. It is noted that the use of these bands is exemplary, is not intended to be limiting, and that other embodiments may include loop-through paths for conveying signals in other bands not discussed herein.

Similar to the embodiment shown in FIG. 3A, receiver 20 of FIG. 3B includes a number of mixers (25-1, 25-2, 25-3, and 25-4), a local oscillator 26 coupled to provide a signal to each of the mixers, a selection circuit 27 coupled to the output of the mixers, an IF amplifier 28, an ADC 29, and a DSP 30. Using selection circuit 27, one of the bands can be selected for further processing by receiver 20. This further processing may occur simultaneously while at least one of the loop-through paths 23 passes a radio signal in its corresponding band between its input and output.

In some instances, not all of the loop-through paths 23 are used during operation of receiver 20. In such instances, it may be desirable to power down components that are not in use. In the embodiment of FIG. 3B, receiver 20 includes a power control unit 33, which may be implemented using hardware, software, or a combination of the two. Power control unit 33 may monitor the status of various components in receiver 20 and may remove power from those that are not currently in use (it is noted that the actual connections are no shown here for the sake of simplicity). For example, if none of the circuitry in a given one of the loop-through paths 23 is in use, power control unit 33 may remove power from its corresponding LNA 21, the corresponding buffer 22, and corresponding AGC circuitry 24. In general, power control unit 33 may allow power to be provided or cause power to be removed from various ones of the circuits on the IC upon which receiver 20 is implemented. Furthermore, power for each of the loop-through paths 23 may be controlled separately, and thus powering down of one loop-through path 23 need not affect the others. Powering down unused circuitry may have a number of benefits, including power savings, lower thermal outputs, and a reduction of noise that can affect those circuits that remain powered on. Furthermore, power control unit 33 may adjust the power consumption of each loop-through path in such that it is reduced without completely removing power therefrom. This may ensure that overall chip power consumption remain within desired limits, while also enabling the loop-through paths to remain powered on. Since power can be adjusted for each loop through path independently of one another, the power and performance of each path may be controlled as needed.

Figure 4:
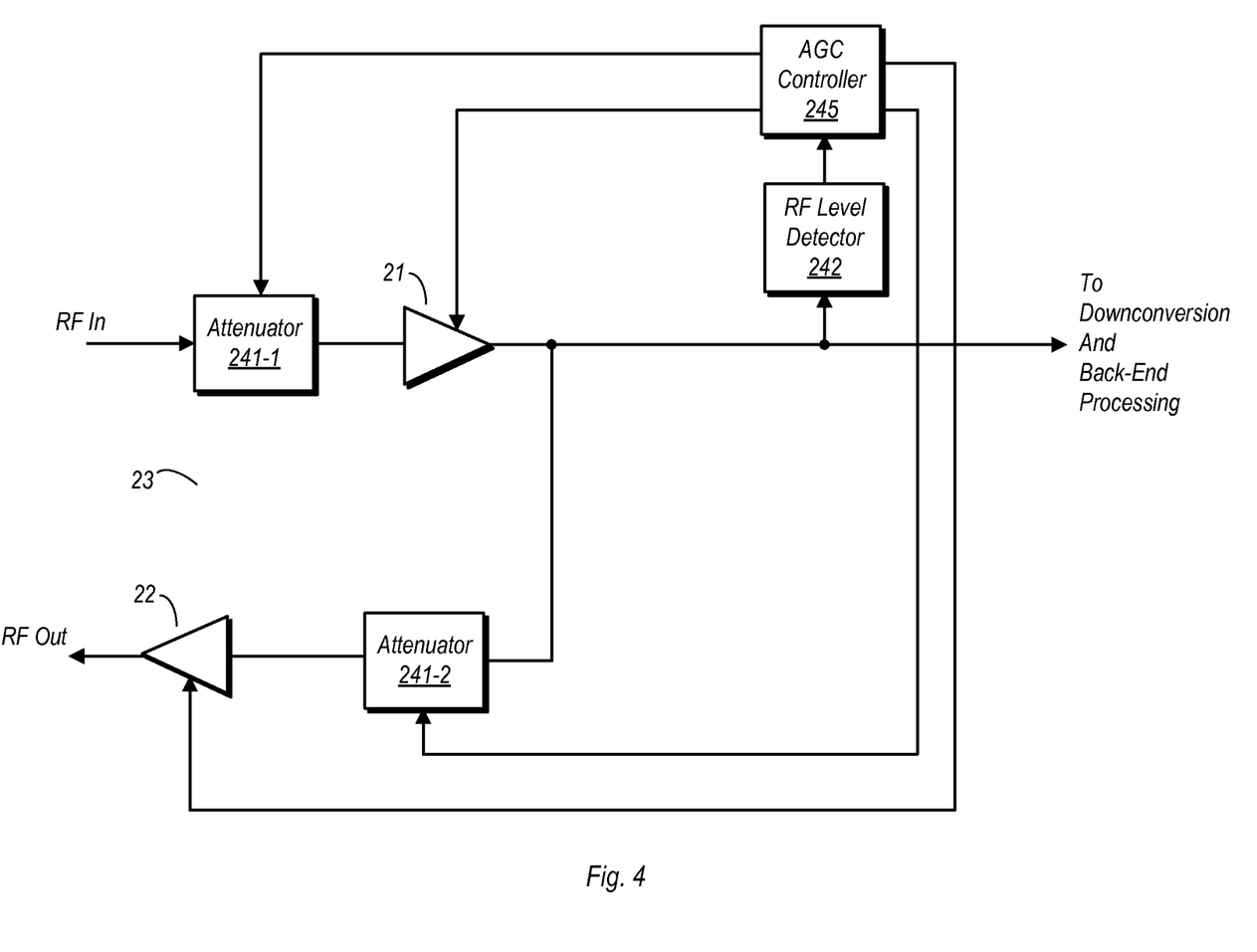
FIG. 4 is a diagram illustrating the arrangement of an automatic gain control apparatus in one embodiment of a receiver chip.

Turning now to FIG. 4, a diagram illustrating one embodiment of AGC circuitry 24 is shown. Since the AGC circuitry 24 is distributed in this embodiment, the elements comprised thereby include attenuators 241-1 and 241-2, RF level detector 242, and AGC controller 245. The other elements shown in the drawing, namely LNA 21 and buffer 22, are not considered to be part of AGC circuitry 24. It is noted that the AGC circuitry illustrated herein is but one embodiment of circuitry that may be used to implement AGC in the various loop-through paths 23 of a receiver 20 as discussed above. However, numerous other embodiments of AGC circuitry are possible and contemplated. It is further noted that AGC circuitry may be configured for operation with a particular frequency band, and thus the different loop-through paths may have different implementations of AGC circuitry with respect to each other. In some implementations attenuator 241-1 and LNA 21 could be combined, and similarly attenuator 241-2 and buffer 22 could be combined. The overall function of adjusting the signal level through the corresponding amplifier to prevent distortion remains the same.

In the embodiment shown, RF level detector may detect a signal level of an RF signal following its output from LNA 21. The detected RF level may be used as feedback. The detected RF level may be reported to AGC controller 245. AGC controller 245 may in turn set gain levels in LNA 21 and buffer 22, as well as setting attenuation levels in attenuators 241-1 and 241-2. As detected RF levels change, AGC controller 245 may continue to make gain and attenuation adjustments.

Figure 5:
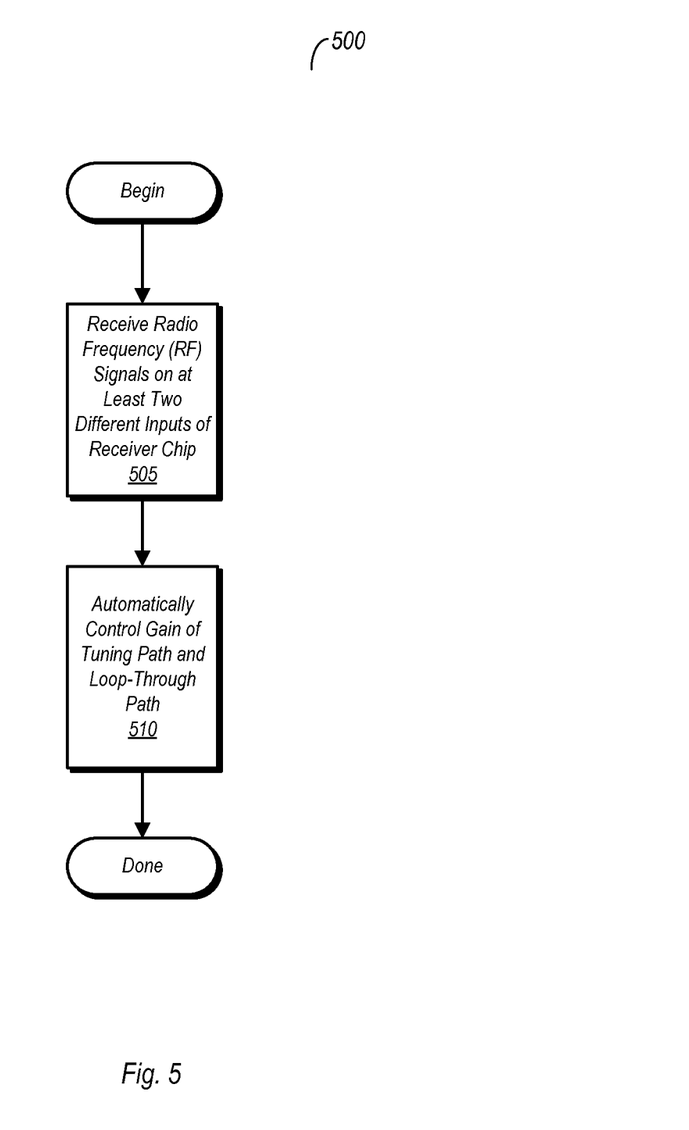
FIG. 5 is a flow diagram illustrating one embodiment of a method for operating a receiver chip having multiple loop-through paths.

FIG. 5 is a flow diagram illustrating one embodiment of a method for operating a receiver chip having multiple loop-through paths. Method 500 may be implemented using any embodiment of receiver 20, including those discussed above as well as those not discussed herein.

Method 500 includes a radio receiver chip receiving RF signals on at least two different inputs (block 505). The radio receiver chip may include at least one loop-through paths coupled to one of the inputs and at least one RF receive path coupled to another one of the inputs. In some embodiments, such as those shown in FIGS. 3A and 3B above, an input may be coupled to a loop-through path, but may also become coupled to downconversion and back end processing circuitry to form a RF receive path. In some embodiments, the inputs may correspond to different frequency bands, although this is not necessary for all embodiments. The maximum number of inputs and corresponding loop-through paths may vary from one embodiment of the receiver chip to another.

Method 500 further includes using AGC on each of the tuning and loop-through paths (block 610). The tuning and loop-through paths may be separately controllable using AGC, each having its own dedicated AGC circuitry. AGC circuitry may be used to adjust gain levels of an LNA in the RF receive path. In a loop-through path, AGC circuitry may be used to adjust gain levels of a buffer. AGC circuitry may also be used to adjust the levels of attenuators that may be implemented in the tuning and loop-through paths.

Numerous variations and modifications will become apparent to those skilled in the art once the above disclosure is fully appreciated. It is intended that the following claims be interpreted to embrace all such variations and modifications.

What is claimed is:

1. A radio receiver comprising:
   a radio frequency (RF) receive path configured to convey a first radio signal within a first band to a radio tuning circuit, wherein the RF receive path is controllable using a first automatic gain control (AGC) circuit; and
   a loop-through path configured to convey a second radio signal within a second band between an input and an output of the radio receiver, wherein the second band is different from the first band, and wherein the loop-through path is controllable using a second AGC control circuit.

2. The radio receiver as recited in claim 1, wherein the loop-through path is further configured to convey a radio signal, within the first band, on the loop-through path.

3. The radio receiver as recited in claim 1, further comprising a plurality of loop-through paths each having an input and an output, the plurality of loop-through paths including the loop-through path, wherein each of the loop-through paths provides a signal path between its respective input and respective output, and wherein a gain through each of the loop-through paths is separately controllable using AGC circuitry.

4. The radio receiver as recited in claim 3, wherein each of the plurality of loop-through paths is configured to pass signals in a one of a plurality of different bands wherein the plurality of bands includes two or more of the following:
   a frequency modulation (FM) band;
   an amplitude modulation (AM) band;
   digital audio broadcast (DAB) L-band; and
   DAB band III.

5. The radio receiver as recited in claim 3, wherein the tuning path RF receive path is coupled to one of the plurality of loop-through paths, and wherein the radio receiver further comprises a selection circuit having a plurality of inputs each coupled to a corresponding one of the plurality of plurality of loop-through paths and an output coupled to the radio tuning circuit, wherein the selection circuit is configured to couple a selected one of the plurality of loop-through paths to the radio tuning circuit.

6. The radio receiver as recited in claim 1, wherein the radio receiver is configured to convey a radio signal in the amplitude modulated (AM) band on the loop-through path.

7. The radio receiver as recited in claim 1, wherein the radio tuning circuit includes:
   a local oscillator configured to generate a periodic signal, wherein the periodic signal has a selectable frequency;
   a mixer coupled to receive the periodic signal and further configured to receive the first signal, wherein the mixer is configured to down-convert the first radio signal to an intermediate frequency (IF) signal.

8. The radio receiver as recited in claim 1, wherein power for each of the tuning and loop-through paths are each separately controllable from one another.

9. A method comprising:
   conveying a first radio signal in a first band to a radio tuning circuit via a radio frequency (RF) receive path of a radio receiver;
   controlling a gain of the first radio signal using first automatic gain control (AGC) circuitry;
   conveying a second radio signal in a second band on a loop-through path between an input and an output of the radio receiver, wherein the second band is different from the first band; and
   controlling a gain of the second radio signal using second AGC circuitry.

10. The method as recited in claim 9, further comprising conveying the second radio signal in the first band on the loop-through path.

11. The method as recited in claim 9, further comprising:
   conveying radio signals through two or more of a plurality of loop-through paths each having an input, an output, and corresponding AGC circuitry;
   controlling a gain in at least one of the plurality of loop-through paths, using its AGC circuitry, separate from the other ones of the plurality of loop-through paths.

12. The method as recited in claim 9, wherein the first band and the second band are selected from the following bands:
   a frequency modulation (FM) band;
   an amplitude modulation (AM) band;
   digital audio broadcast (DAB) L-band; and
   DAB band III.

13. The method as recited in claim 9, wherein the second band is an amplitude modulated (AM) band on the loop-through path.

14. A radio receiver comprising:
   a radio receiver integrated circuit including a plurality of loop-through paths each having an input and an output, wherein each of the loop-through paths provides a signal path between its respective input and respective output, and wherein a gain through each of the loop-through paths is separately controllable using automatic gain control (AGC).

15. The radio receiver as recited in claim 14, wherein each of the plurality of loop-through paths includes a corresponding low noise amplifier (LNA), wherein the LNA of each of the plurality of loop-through paths includes an input coupled to the input of its corresponding loop-through path.

16. The radio receiver as recited in claim 15, wherein each of the plurality of loop-through paths includes a corresponding buffer circuit having input coupled to an output of the corresponding LNA of that loop-through path and an output coupled to the output of its corresponding loop-through path.

17. The radio receiver as recited in claim 14, wherein each of the plurality of loop-through paths is configured to pass signals in a unique one of a plurality of frequency bands.

18. The radio receiver as recited in claim 17, wherein the plurality of bands includes two or more of the following:
   a frequency modulation (FM) band;
   an amplitude modulation (AM) band;
   digital audio broadcast (DAB) L-band;
   DAB band III.

19. The radio receiver as recited in claim 14, wherein power for each of the plurality of loop-through paths is separately controllable.

20. The radio receiver as recited in claim 14, wherein the plurality of loop-through paths is implemented on a single integrated circuit.

* * * * *